(12) United States Patent
Linder

(10) Patent No.: US 6,594,364 B2
(45) Date of Patent: *Jul. 15, 2003

(54) ADAPTIVE NOISE REJECTION SYSTEM AND METHOD

(75) Inventor: Frank X Linder, Oxford, CT (US)

(73) Assignee: Esion-Tech, LLC, Monroe, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 09/999,476

(22) Filed: Nov. 15, 2001

(65) Prior Publication Data

US 2002/0041691 A1 Apr. 11, 2002

Related U.S. Application Data

(63) Continuation-in-part of application No. 09/605,569, filed on Jun. 28, 2000, now Pat. No. 6,320,968.

(51) Int. Cl.$^7$ ............................................. H03B 29/00
(52) U.S. Cl. ................................ 381/71.14; 381/71.1
(58) Field of Search ............................. 381/94.1, 94.2, 381/71.1, 71.14

(56) References Cited

U.S. PATENT DOCUMENTS

| | | | |
|---|---|---|---|
| 4,153,815 A | 5/1979 | Chaplin et al. .............. 179/1 P |
| 4,604,501 A | 8/1986 | Richmond et al. ......... 179/81 B |
| 4,672,674 A | 6/1987 | Clough et al. .............. 381/94.7 |
| 4,736,432 A | 4/1988 | Cantrell ....................... 381/83 |
| 4,878,188 A | 10/1989 | Ziegler, Jr. .............. 364/724.01 |
| 4,901,354 A | 2/1990 | Gollmar et al. .............. 381/110 |
| 4,932,063 A | 6/1990 | Nakamura .................... 389/94 |
| 5,033,082 A | 7/1991 | Eriksson et al. ............. 379/410 |
| 5,046,103 A | 9/1991 | Warnaka et al. ............... 381/71 |
| 5,054,078 A | 10/1991 | Schorman et al. .......... 381/110 |
| 5,117,461 A | 5/1992 | Moseley ....................... 381/72 |
| 5,138,664 A | 8/1992 | Kimura et al. ................ 381/72 |
| 5,204,909 A | 4/1993 | Cowan ....................... 381/106 |
| 5,251,263 A | 10/1993 | Andrea et al. ................. 381/71 |
| 5,293,578 A | 3/1994 | Nagami et al. ............. 381/73.1 |
| 5,381,473 A | 1/1995 | Andrea et al. ............... 379/387 |
| 5,398,286 A | 3/1995 | Balestri et al. ............... 381/94 |
| 5,412,735 A | 5/1995 | Engebretson et al. .... 381/71.13 |
| 5,416,844 A | 5/1995 | Nakaji et al. ............... 381/71.9 |
| 5,455,779 A | 10/1995 | Sato et al. ................... 364/574 |
| 5,473,702 A | 12/1995 | Yoshida et al. ............ 381/94.7 |
| 5,652,799 A | 7/1997 | Ross et al. ............... 381/71.11 |
| 5,825,898 A | 10/1998 | Marash ......................... 381/92 |
| 5,835,608 A | 11/1998 | Warnaka et al. ........... 381/94.7 |
| 5,917,921 A | 6/1999 | Sasaki et al. .............. 381/94.1 |
| 5,953,380 A | 9/1999 | Ikeda ......................... 381/94.1 |
| 6,072,881 A | 6/2000 | Linder ....................... 381/94.1 |

FOREIGN PATENT DOCUMENTS

WO    WO0055846    9/2000

OTHER PUBLICATIONS

AT&T Product Note, Jul. 1992 "Speaker–Trained Voice Recognizer".

*Primary Examiner*—Forester W. Isen
*Assistant Examiner*—Brian T. Pendleton
(74) *Attorney, Agent, or Firm*—Raymond Nuzzo

(57) ABSTRACT

An adaptive noise rejection method and apparatus. An information signal having an information component and a repetitive noise component having a varying characteristic frequency is delayed the information signal by a reference delay time that is equal that is equal to a predetermined number of periods of the characteristic frequency to form a delayed information signal. The delayed information signal is subtracted from the information signal to form a processed information signal in which the information component is substantial and the noise component is negligible. The amplitude of the noise component of the processed information signal is constantly monitored. The delay of the information signal is varied as the characteristic frequency of the noise component changes so as to maintain the amplitude of the noise component of the processed information signal at a predetermined level.

16 Claims, 2 Drawing Sheets

Error Channel Derivation For The Feedback Servo Loop

1

ADAPTIVE NOISE REJECTION SYSTEM AND METHOD

CROSS-REFERENCE TO RELATED APPLICATIONS

This is a continuation-in-part of copending U.S. application Ser. No. 09/605,569, filed Jun. 28, 2000 is now U.S. Pat. No. 6,320,968.

BACKGROUND OF THE INVENTION

1. Field of the Invention

The present invention relates to noise rejection systems, and more particularly to a system and method for rejecting repetitive noise from an information signal.

2. Problem to be Solved

Communication systems are often subject to repetitive background noise. For example, automobile muffler systems, manufacturing machinery, vehicle, boat and airplane engines and other source of repetitive noise can interfere with acoustic signal receiving devices located near the noise source such as microphones, telephones, hydrophones, vibration sensors, or electronic transducers. In particular, microphones in emergency vehicle communication systems associated with police cars fire trucks and ambulances receive not only a user's voice, but also a repetitive background noise generated by the emergency vehicle siren. Such repetitive background noise often overpowers a user's voice so that a user's message is difficult to understand. If voice-activated communication systems are employed, background noise increases the difficulty in recognizing voice commands that automatically activate and deactivate the communication system.

Microphone noise rejection systems have been developed to minimize the level of background noise relative to the level of the desired information or voice signal. Such noise rejection systems typically comprise dual microphones in which a first microphone primarily receives background noise and a second microphone primarily receives both background noise and an information or voice signal. The noise signal is then added to or subtracted from the information signal in order to cancel noise from the information signal. For example, U.S. Pat. No. 5,381,473 discloses a noise-rejection system that uses two microphones to receive respectively a noise signal and a source signal. The noise and source signals are supplied to a differential amplifier to cancel noise from the source signal. Similarly, U.S. Pat. No. 6,072,881 also discloses a system in which a first microphone primarily receives background noise and a second microphone primarily receives both background noise and an information or voice signal.

The use of a separate microphone for each distinct noise source, as described in the patents mentioned above, substantially increases the per-unit cost of such noise rejection systems. Furthermore, installation of such systems is difficult, time consuming and costly since a separate microphone must be strategically located in proximity to each distinct noise source. As a result, an inordinate amount of cables or wire and connectors must be used to ensure that noise signals emanating from all distinct noise sources are eliminated.

It is therefore an object of the present invention to provide a noise rejection system that substantially eliminates repetitive background noise from an information or voice signal without the disadvantages inherent in the prior approaches to noise rejection.

SUMMARY OF THE INVENTION

In one aspect, the present invention is directed to a method of rejecting noise introduced into an information signal, comprising the steps of receiving an information signal having an information component and a repetitive noise component having a varying characteristic frequency, delaying the information signal by a reference delay time that is equal to a predetermined number of periods of the characteristic frequency to form a delayed information signal, subtracting the delayed information signal from the information signal to form a processed information signal in which the information component is substantial and the noise component is negligible, determining the amplitude of the noise component of the processed information signal, and varying the delay of the information signal as the characteristic frequency of the noise component changes in order to maintain the amplitude of the noise component of the processed information signal at a predetermined level.

One advantage of the present invention is that the adaptive noise rejection system does not require separate microphones or other acoustic signal detection device for each distinct noise source.

Another advantage of the present invention is that the noise rejection system does not suffer from the phase alignment problems inherent in adding or subtracting information and noise signals in order to remove the noise component from the information signal.

Other objects and advantages of the present invention will become apparent in view of the following detailed description and accompanying drawings.

DETAILED DESCRIPTION OF THE PREFERRED EMBODIMENTS

Figure 1:
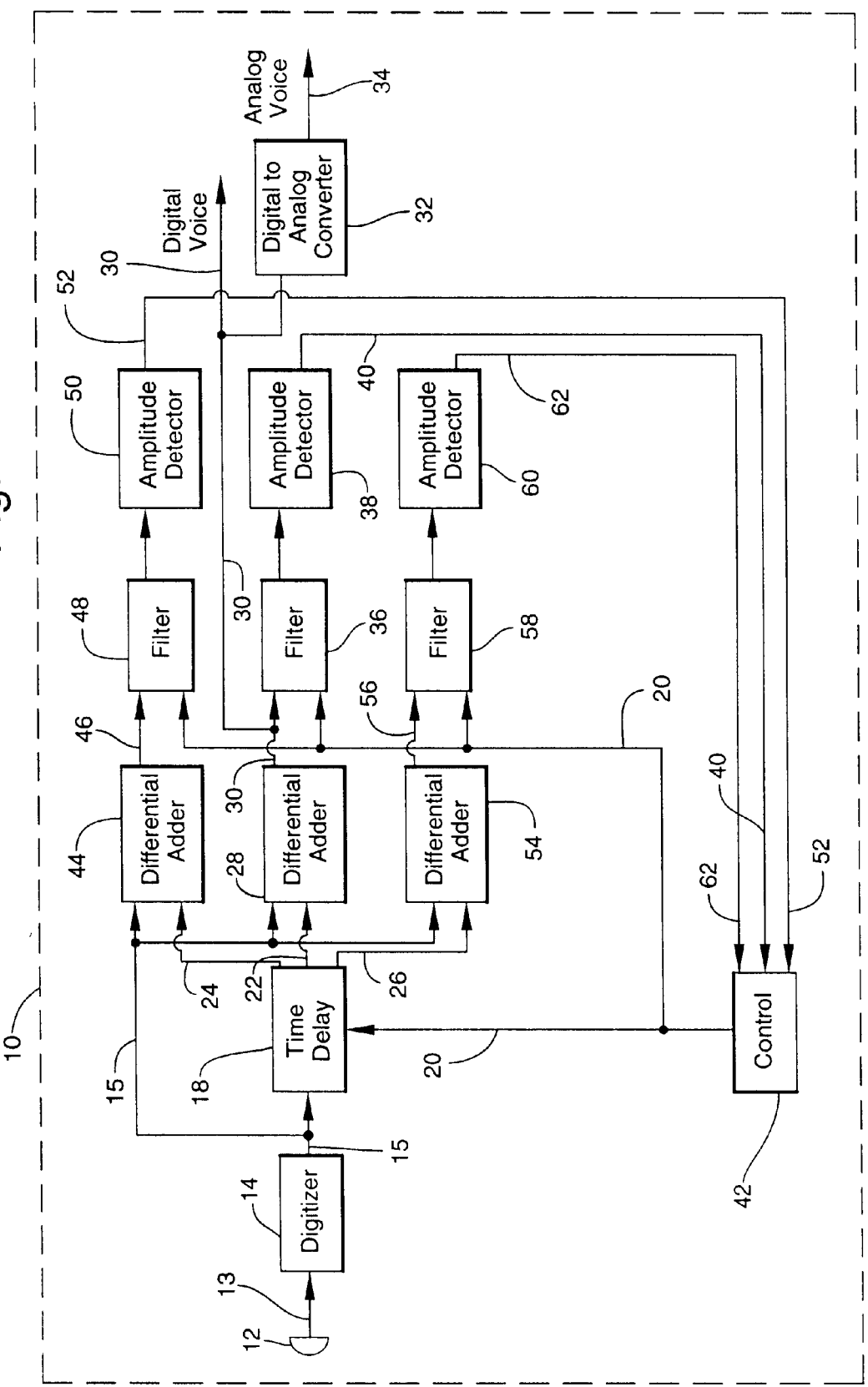
FIG. 1 is a block diagram of the adaptive noise rejection system of the present invention.

FIG. 1 schematically illustrates adaptive noise rejection system 10 of the present invention, which substantially eliminates repetitive background noise from a microphone communication system. System 10 comprises an information signal input interface 12 for receiving analog information or voice signal. Interface 12 can be configured as any acoustic signal receiving device, e.g. microphone, hydrophone, telephone receiver, acoustic signal sensors, etc. Microphone 12 outputs analog information signals 13 that have an information component and a repetitive noise component. The repetitive noise signal has a characteristic frequency and associated period. Information signals 13 are coupled to digitizer 14. The desired sampling period of digitizer 14 corresponds to the characteristic frequency of the repetitive noise signal. For example, the sampling period may correspond to a full period or multiples thereof of the repetitive noise signal. In one embodiment, digitizer 14 comprises an analog-to-digital converter ("ADC"). Digitizer 14 converts the voltage levels and impedances from those of the microphone to those required by an A/D chip for optimal (minimum mean square error) quantization. Digitizer 14 converts information signals 13 into digital information signals 15. Digital information signals 15 are then inputted into digital time delay circuit 18 and other circuitry that is discussed in the ensuing discussion. In a preferred embodiment, a digital data bus, well known in field of digital electronics, is used to route digital information signal 15 to the components of system 10.

In one embodiment, digital time delay module 18 is comprised of a block of memory in which all digital signals are stored in a sequential manner. Digital time delay circuit 18 can be realized by a random access memory or RAM, a read-only memory or ROM, or an erasable read-only-memory or EPROM. In another embodiment, digital delay module 18 is configured to comprise a bucket brigade device, which is described in U.S. Pat. No. 6,072,881, the disclosure of which is incorporated herein by reference. In such a configuration, the bucket brigade device has a predetermined number of stages, each stage storing portions of the information signal. The bucket brigade device includes an input terminal for receiving the information signal, an output terminal for supplying delayed information signals 22, 24, and 26, and a control terminal for receiving control signal 20 from a control circuit (not shown) which instructs the bucket brigade device to advance a portion of the information signal by at least one stage. The total time interval for a portion of the information signal to pass through the bucket brigade device is equal to the desired reference delay time. Other suitable electronic circuit configurations can also be used to create delayed information signals.

Digital information signal 15 is stored in memory within digital time delay circuit 18 for a predetermined time delay that is a function of the period associated with the current characteristic frequency of the noise component of digital information signal 15. This predetermined time delay is referred to herein as the "reference time delay". The reference time delay can be any number of periods of the characteristic frequency of the repetitive noise signal. In one embodiment, the reference time delay corresponds to one full period of the noise signal. For purposes of the ensuing description, the reference time delay will correspond to one period of the characteristic frequency of the repetitive noise signal. The characteristic frequency, as mentioned above, may vary with time but may be treated generally as a constant within the brief delay times associated with a few periods of the noise signal. Digital time delay circuit 18 varies the reference time delay in accordance with the data defined by digital control signal 20. This feature is described in detail in the ensuing description.

After the delay time elapses, the time delay circuit 18 accesses the memory therein and retrieves the stored digital information signal 15 and outputs this signal as delayed information signal 22 which is delayed, with respect to the non-delayed digital information signal 15, by the reference time delay. Digital delay circuit 18 is configured to simultaneously output delayed digital information signals 24 and 26. Signal 24 is delayed, with respect to information signal 15, by a predetermined time delay that is less than the reference time delay. Signal 26 is delayed, with respect to digital information signal 15, by a predetermined time delay that is relatively more than the reference time delay. As explained in the foregoing description, the amount of time represented by the reference time delay is defined by control signal 20.

Information signal 15 (also referred to herein as "non-delayed information signal") and delayed information signal 22 are inputted into differential adder circuit 28 which digitally subtracts the level of delayed information signal 22 from that of non-delayed information signal 15 to form a processed digital information signal 30 in which the level of the information component is substantial and the level of the noise component is negligible. The effect of the foregoing processing is to cancel the repetitive portion (noise component) of the information signal while substantially maintaining the non-repetitive component (information or voice signals) received by the microphone 12. Processed digital information signal 30 is then inputted into digital-to-analog converter ("DAC") 32, which converts signal 30 into analog signal 34. Processed digital information signal 30 is also outputted in digital form for use by other digital circuitry, components or equipment, e.g. spectrum analyzers, digital recording equipment, etc.

Processed digital information signal 30 is also inputted into filter 36. In one embodiment, filter 36 is a programmable digital band pass filter having a variable center frequency Fc. In a preferred embodiment, center frequency Fc can be varied by control signal 20. This feature is discussed in detail in the ensuing description. The center frequency Fc is the current characteristic frequency of the noise component of information signal 13. Filter 36 removes the information component from processed digital information signal 30 and outputs any remaining noise component. The output of filter 36 is then inputted into amplitude detector 38. Amplitude detector 38 outputs a digital signal 40 that represents the amplitude or level of the noise component outputted by filter 36. Digital signal 40 is then inputted into control circuit 42. The purpose of this configuration is discussed in detail in the ensuing description.

Digital delay circuit 18 simultaneously outputs delayed information signal 24 along with delayed information signal 22, which was described in the foregoing description. Delayed information signal 24 is inputted into differential adder circuit 44 which digitally subtracts the level of delayed information signal 24 from that of non-delayed digital information signal 15 to form processed digital information signal 46. Since the delay of delayed information signal 24 is less than the reference delay, the delay of signal 24 is not associated with the period of the current characteristic frequency of the noise component, but rather, is associated with a relatively higher frequency. Thus, the amplitude or level of the noise component of processed digital information signal 46 is substantially higher than the amplitude or level of the noise component of processed digital information signal 30.

Processed digital information signal 46 is then inputted into filter 48. In one embodiment, filter 48 is configured as the same type of filter as filter 36. Filter 48 has a center frequency Fc that is the current characteristic frequency of the noise component of information signal 13. The center frequency Fc can be varied by digital control signal 20. Filter 48 filters processed digital information signal 46 so as to remove the information component and output only the noise component. The output of filter 48 is then inputted into amplitude detector 50. Amplitude detector 50 outputs a digital signal 52 that represents the amplitude of the noise component of the signal outputted by filter 48. Digital signal 52 is inputted into control circuit 42. The purpose of this configuration will be discussed in detail in the ensuing description.

Digital delay circuit 18 simultaneously outputs delayed information signal 26 in addition to delayed signals 22 and 24. The delay of information signal 26 is relatively longer the reference delay of information signal 22 and corresponds to a frequency that is relatively lower than the characteristic frequency of the noise component. Therefore, the amplitude or level of the noise component of processed signal 56 is substantially higher than the amplitude or level of the noise component of processed information signal 30. Delayed information signal 26 is inputted into differential adder circuit 54 which digitally subtracts the level of delayed information signal 26 from that of non-delayed information signal 15 to form processed information signal 56. Processed information signal 56 is then inputted into filter 58. In one embodiment, filter 58 is configured as the same type of filter as filter 36. Filter 36 has a center frequency Fc that is the current frequency of the noise component of information signal 13. The center frequency Fc can be varied by control signal 20. Filter 58 filters processed information signal 56 so as to remove the information component and pass only the noise component. The output of filter 58 is then inputted into amplitude detector 60. Amplitude detector 60 outputs digital signal 62 that represents the amplitude or level of the noise component of the signal outputted by filter 58. The purpose of this configuration will be discussed in detail in the ensuing description.

Control circuit 42 receives digital signals 40, 52 and 62 outputted by amplitude detectors 38, 50 and 60, respectively. Control circuit 42 contains circuitry that effects comparison of the amplitudes represented by the digital signals outputted by amplitude detector 38, 50 and 60 to determine whether the amplitude represented by digital signal 40 is relatively lower than the amplitude represented by digital signal 52 and the amplitude represented by digital signal 62. If control circuit 42 determines that the amplitude represented by signal 40 is lower than the amplitudes represented by signals 52 and 62, then control circuit 42 outputs control signal 20 that is inputted into time delay circuit 18 so as to maintain the current reference time delay. Control signal is also inputted into filters 36, 48 and 58 to maintain the current center frequency Fc of the pass band of the filters.

If the characteristic frequency of the noise component of information signal 13 increases to another frequency, the current reference delay time will not be equal to the period of the new characteristic frequency of the noise component. Therefore, there will be no cancellation of the noise component in differential adder 28. As a result, the amplitude or level of the noise component of processed information signal 30 is significantly increased.

The time delay of information signal 24 is always less than the reference time delay of information signal 22 and therefore corresponds to a frequency that is higher than the initial characteristic frequency of the noise component. Thus, as the time delay of signal 24 approaches the period of the new characteristic frequency of the noise component, the cancellation of the noise component by differential adder 44 substantially increases. As a result, differential adder circuit 44 outputs processed information signal 46 in which the level of the information component is substantial and the level of the noise component is negligible.

As a result of the increase in the cancellation of the noise component by differential adder circuit 44, amplitude detector 50 outputs digital signal 52 that represents an amplitude that is relatively lower than the amplitudes represented by digital signals 40 and 62 outputted by amplitude detectors 38 and 60, respectively. Control circuit 42, upon determining that digital signal 52 represents the lowest amplitude or level of the noise component, outputs digital control signal 20 that is inputted into digital time delay circuit 18 so as to control circuit 18 to vary the reference delay to match the period of the new characteristic frequency of the noise component. Specifically, the new reference time delay is less than the previous reference time delay since the frequency of the noise component has increased. Accordingly, the new time delay of information signal 24 is less than the new reference time delay and the new time delay of information signal 26 is greater than the new reference time delay. Control signal 20 also controls digital band pass filters 36, 48 and 58 to change the center frequency Fc of the pass band to a frequency that matches the new characteristic frequency of the noise component.

As a result of control circuit 42 changing the reference time delay to correspond to the period of the new characteristic frequency of the noise component, the cancellation of the noise component by digital addition circuit 28 returns to the previous level that was achieved prior to the increase of the characteristic frequency of the noise component.

System 10 implements an initialization process in order to determine the initial reference time delay because the characteristic frequency of the noise component of information signal 13 is not initially known. When system 10 is activated, and audio or acoustical signals are received by input interface 12, control circuit 42 outputs a sequence of control signals 20 that control digital time delay circuit 18 to increase the reference delay in graduations starting from an initial reference time delay to a maximum reference time delay. In a preferred embodiment, the initial and reference time delays cover an audio frequency range that encompasses all types of noise sources. In one embodiment, the initial reference time delay corresponds to the period of 300 Hz (Hertz) and the maximum reference time delay corresponds the period of 3500 Hz. As control circuit 42 sweeps through this range of time delays, control circuit 42 monitors the amplitudes represented by digital signals 40, 52 and 62. Specifically, control circuit 42 stores in memory the particular reference time delays that cause the amplitude or level represented by signal 40 to be relatively lower than the amplitudes represented by the digital signals 52 and 62. The reference time delays which cause the amplitude represented by digital signal 40 to be relatively lower than the amplitudes represented by signals 52 and 62 can be the period of the fundamental frequency of the noise component or a harmonic frequency of the noise component. Normal operation of system 10 can begin once control circuit 42 completely sweeps the range of possible reference time delays and stores the relevant reference time delays in memory. In one embodiment, control circuit 42 controls digital time circuit 18 to delay information signal 15 by a reference time delay that is equal to one period of the characteristic frequency of the noise component. Typically, this particular reference time delay will be the very first reference time delay stored in memory as control circuit 42 sweeps the range of possible reference time delays.

The functions of the components of system 10 which were described in the foregoing description can be implemented in a commercially available digital processor (DSP). Examples of suitable digital signal processors are model TMSC5000 manufactured by Texas Instruments™ and model AT73580DSP manufactured by ATMEL™. These are just two examples of suitable digital signal processors. Other suitable commercially available digital processors are manufactured by Hitachi, Intel and Motorola.

Figure 2:
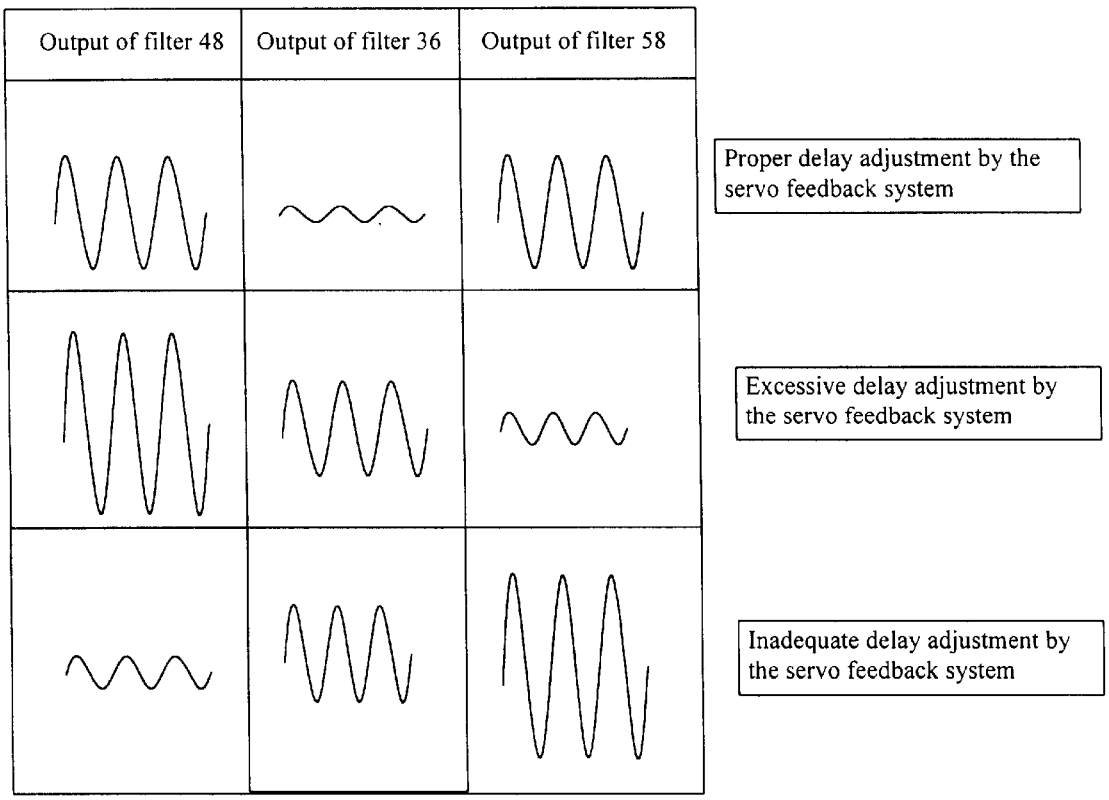
FIG. 2 is a diagram that illustrates the signals outputted from filters shown in FIG. 1 for various time delays produced by the servo feedback system shown in FIG. 1.

Referring to FIG. 2, there is shown the output of filters 48, 36 and 58. As described in the foregoing description, the output of filters 48, 36 and 58 are processed by amplitude detectors 50, 38 and 60, respectively. Amplitude detectors 50, 38 and 60 output signals 52, 40 and 62, respectively, which are inputted into control circuit 42. The amplitude and relative slope of signals 52, 40 and 62 are used to derive the error in the time delay, time delay circuit 18 and filters 48, 36 and 58. The relative magnitude of signals 52, 40 and 62 provides the magnitude and direction of the error signal required to maintain servo lock.

Operation

The operation of adaptive noise rejection system 10 will now be explained in detail. The first step is the initialization process described in the foregoing description so as to determine the initial reference delay time to be used in normal operation of system 10.

After the initialization process, normal operation may begin. Input interface 12 receives an audio information signal having an information component, such as a user's voice signal, and a repetitive noise component originating from a noise source. Input interface 12 continuously generates an analog electrical information signal 13 which is inputted to digitizer 14. Digitizer 14 converts or transforms analog information signal 13 into digital information signal 15. Digital information signal 15 is then inputted into digital time delay circuit 18. Circuit 18 simultaneously outputs delayed information signals 22, 24 and 26. Signal 22 is delayed by the reference time delay (e.g. one period of the characteristic frequency of the noise component). Signal 24 is delayed by an amount of time that is less than the reference time delay. Signal 26 is delayed by an amount of time that is greater than the reference time delay.

Non-delayed information signal 15 and delayed information signal 22 are inputted into differential adder circuit 28 which digitally subtracts delayed information signal 22 from non-delayed information signal 15. Differential adder circuit 28 outputs processed information signal 30 in which the level of the information component is substantial and the level of the noise component is negligible. Processed digital information signal 30 is then inputted into DAC 32 which transforms the digital processed information signal 30 into an analog processed information signal 34. Processed digital information signal 30 is also outputted in digital form for use by other digital processing or analysis equipment.

Similarly, non-delayed information signal 15 and delayed information signal 24 are inputted into differential adder circuit 44 which digitally subtracts delayed information signal 24 from non-delayed information signal 15. Differential adder circuit 44 outputs processed information signal 46 in which the level of the noise component is substantially greater than the level of the noise component of processed information signal 30. As explained in the foregoing description, the level of the noise component of processed signal 46 is greater than the level of the noise component of processed information signal 30 because the time delay of delayed information signal 24 is less than the reference time delay thereby significantly degrading the cancellation of noise by differential adder circuit 44.

Similarly, non-delayed information signal 15 and delayed information signal 26 are inputted into differential adder circuit 54 which digitally subtracts delayed information signal 26 from non-delayed information signal 15. Differential adder circuit 54 outputs processed information signal 56 in which the level of the level of the noise component is relatively greater than the level of the noise component of processed information signal 30. As explained in the foregoing description, the level of the noise component of processed signal 56 is greater than the level of the noise component of processed information signal 30 because the time delay of delayed information signal 26 is greater than the reference time delay thereby significantly degrading the cancellation of noise by differential adder circuit 54.

The outputs of differential adder circuits 28, 44 and 54 are inputted into digital filters 36, 58 and 48, respectively. Control signal 20 is also inputted into each filter 36, 58 and 48 to set the center frequency Fc of each filter as the current characteristic frequency of the noise component. Filters 36, 48 and 58 filter out the information component of the processed information signals 30, 46 and 56, respectively, and outputs the noise components of the aforementioned processed information signals. The outputs of filters 36, 48 and 58 are inputted into amplitude detectors 38, 50 and 60, respectively. Amplitude detectors 38, 50 and 60 output digital signals 40, 52 and 62, respectively, which represent the amplitude of the noise components of signals outputted by filters 36, 48 and 58, respectively. Digital signals 40, 52 and 62 are then inputted into control circuit 42. Control circuit 42 effects comparison of the amplitudes represented by digital signals 40, 52 and 62. If control circuit 42 determines that the amplitude or level of the noise component of processed information signal 30 is relatively lower than the amplitude or level of the noise component of processed signals 46 and 56, then control circuit 42 maintains the current reference time delay and the center frequency Fc of filters 36, 48 and 58.

As the characteristic frequency of the noise component of information signal 13 increases, the reference time delay is no longer equal to the period of the characteristic frequency of noise component. As a result, the amplitude of the noise component of processed information signal 30 substantially increases because there is now only minimal cancellation of the noise component. Since the characteristic frequency has increased, and the delay of signal 24 corresponds to a frequency that is relatively higher than the initial characteristic frequency of the noise component, the amplitude or level of the noise component of the processed information signal 46 substantially decreases. Subsequently, control circuit 42 now determines that the amplitude or level of the noise component of processed information signal 46 is now relatively lower than the amplitudes or levels of the noise component of processed information signals 30 and 56. Control circuit 42 then outputs digital control signal 20 which effects a decrease in the reference time delay created by digital time delay circuit 18 so as to provide a new reference time delay that is equal to the period of the new characteristic frequency of the noise component. Digital control signal 20 also effects shifting of the center frequency Fc of each filter 36, 48 and 58 to the new characteristic frequency of the noise component.

As the characteristic frequency of the noise component of information signal 13 decreases, reference time delay is no longer equal to the period of the characteristic frequency of noise component. As a result, the amplitude of the noise component of processed information signal 30 substantially increases because there is now only minimal cancellation of the noise component. Since the characteristic frequency has decreased, and the delay of signal 26 corresponds to a frequency that is relatively lower than the initial characteristic frequency of the noise component, the amplitude or level of the noise component of the processed information signal 26 substantially decreases. As a result, control circuit 42 determines that the amplitude or level of the noise component of processed information signal 56 is now relatively lower than the amplitude or level of the noise component of processed information signals 30 and 46. Control circuit 42 then outputs digital control signal 20 which effects an increase in the reference time delay created by digital time delay circuit 18 so as to provide a new reference time delay that is equal to the period of the new characteristic frequency of the noise component. Digital control signal 20 also effects shifting of the center frequency Fc of each filter 36, 48 and 58 to the new frequency of the noise component.

Thus, amplitude detectors 38, 50 and 60 and control circuit 42 function as a feedback loop that controls time delay circuit 18 to constantly produce a reference time delay that is equal to the period of the current characteristic frequency of the noise component. In other words, amplitude detectors 38, 50 and 60 and control circuit 42 automatically vary the reference time delay to match the period of the characteristic frequency of the noise component as this characteristic frequency changes over time.

The adaptive noise rejection system of the present invention improves upon the phase alignment difficulties inherent in noise rejection systems, which add or subtract information signals with noise signals. With prior noise rejection systems that mathematically manipulate a noise signal with an information signal, it is difficult to establish a reference by which to precisely control the phase relationship between the signals. In the present invention as described above, the noise component is not mathematically manipulated with an information signal. Rather, the noise component determines the precise reference time delay to apply to the information signal for forming a delayed information signal relative to the non-delayed information signal. Once the reference time delay is determined, the precisely delayed information signal can be mathematically manipulated with the non-delayed information signal in order to cancel noise therefrom.

The analog-to-digital and digital-to-analog conversions can be accomplished by any suitable chip or chips, e.g. Texas Instruments TLC 32046 A/D/D/A. As described in the foregoing description, commercially available digital signal processor chips may be used to implement some of the functions performed by the components of system 10. Another suitable commercially available digital signal processor is the Motorola DSP56001 which is described in U.S. Pat. No. 5,251,263, the disclosure of which is incorporated herein by reference.

It will be apparent to one of skill in the art that system 10 can be used with relatively low RF (i.e. radio frequencies). In such a configuration, some of the components of system 10 may be replaced with components suitable for handling such radio frequencies. Furthermore, for some radio frequencies, system 10 could be embodied on a circuit board configured with 50 ohm cladding to effect electrical connection between components.

It is to be understood that the present invention can be embodied in the form of computer-implemented processes and apparatuses for practicing those processes. The present invention can also be embodied in the form of computer program code embodied on tangible media, such as floppy diskettes, CD-ROMs, hard drives, or any other computer-readable storage medium, wherein when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments combine with the microprocessor to provide a unique device that operates analogously to specific logic circuits.

The principals, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. A storage medium encoded with machine-readable computer program code for processing an information signal, comprising:

means for causing a computer to receive an information signal having an information component and a repetitive noise component having a varying characteristic frequency;

means for causing the computer to delay the information signal by a reference delay time that is equal to a predetermined number of periods of the characteristic frequency to form a delayed information signal;

means for causing the computer to process the information signal and the delayed information signal to form a processed reference information signal in which the information component is substantial and the noise component is negligible;

means for causing the computer to determine the amplitude of the noise component of the processed reference information signal; and means for causing the computer to vary the delay of the information signal as the characteristic frequency of the noise component changes in order to maintain the noise component of the processed reference information signal at a predetermined level.

2. The storage medium encoded with machine-readable computer program code for processing an information signal according to claim 1 wherein the means for causing the computer to delay the information signal further comprises means for causing the computer to simultaneously provide (i) a second delayed information signal that is delayed, with respect to the information signal, by an amount of time that is less than the reference delay time, and (ii) a third delayed information signal that is delayed, with respect to the information signal, by an amount of time that is greater than the reference delay time.

3. The storage medium encoded with machine-readable computer program code for processing an information signal according to claim 2 wherein the means for causing the computer to process the information signal and the delayed information comprises:

means for causing the computer to process the second delayed information signal with the received information signal to provide a second processed signal; and means for causing the computer to process the third delayed information signal with the received information signal to provide a third information signal.

4. The storage medium encoded with machine-readable computer program code for processing an information signal according to claim 3 wherein the means for causing the computer to vary the delay of the information signal comprises:

means for causing the computer to determine the amplitude of the noise component of the second processed signal;

means for causing the computer to determine the amplitude of the noise component of the third information signal; comparing the amplitude of the noise component of the reference processed information signal with the noise components of the second and third processed information signals;

means for causing the computer to maintain the current reference delay time if the amplitude of the noise component of the referenced processed information signal is relatively lower than the amplitudes of the noise components of both the second and third processed information signals;

means for causing the computer to decrease the reference delay time if the amplitude of the noise component of the second processed information signal is relatively lower than the amplitude of the noise components of both the referenced processed information signal and the third processed information signal; and means for causing the computer to increase the reference time delay if the amplitude of the noise component of the third processed information signal is relatively lower than the amplitude of the noise components of both the referenced processed information signal and the second processed information signal.

5. The storage medium encoded with machine-readable computer program code for processing an information signal according to claim 3 wherein the means for causing the computer to determine the amplitude of the noise component comprises means for causing the computer to detect the amplitude of the noise component of the reference processed information signal.

6. The storage medium encoded with machine-readable computer program code for processing an information signal according to claim 5 wherein the means for causing the computer to determine the amplitude of the noise component of the second processed information signal comprises means for causing the computer to detect the amplitude of the noise component of the second processed information signal.

7. The storage medium encoded with machine-readable computer program code for processing an information signal according to claim 6 wherein the means for causing the computer to determine the amplitude of the noise component of the third processed information signal comprises means for causing the computer to detect the amplitude of the noise component of the third processed information signal.

8. The storage medium encoded with machine-readable computer program code for processing an information signal according to claim 3 further comprising means for causing the computer to filter the reference, second and third processed information signals to remove the information component before the computer varies the delay of the information signal.

9. The storage medium encoded with machine-readable computer program code for processing an information signal according to claim 1 wherein means for causing the computer to process the information signal comprises means for causing the computer to subtract the delayed information signal from the received information signal.

10. The storage medium encoded with machine-readable computer program code for processing an information signal according to claim 3 wherein the means for causing the computer to process the second delayed information signal with the received information signal comprises means for causing the computer to subtract the second delayed information signal from the received information signal.

11. The storage medium encoded with machine-readable computer program code for processing an information signal according to claim 3 wherein the means for causing the computer to process the third delayed information signal with the received information signal comprises means for causing the computer to subtract the third delayed information signal from the received information signal.

12. The storage medium encoded with machine-readable computer program code for processing an information signal according to claim 1 wherein the received information signal is an analog signal and wherein the means for causing the computer to receive the information signal comprises means for causing the computer to convert the analog information signal into a digital information signal.

13. The storage medium encoded with machine-readable computer program code for processing an information signal according to claim 1 further comprising means for causing the computer to convert the reference processed information signal into a processed analog signal.

14. The storage medium encoded with machine-readable computer program code for processing an information signal according to claim 3 further comprising means for causing the computer to filter the reference, second and third processed information signals to remove the information component.

15. The storage medium encoded with machine-readable computer program code for processing an information signal according to claim 14 wherein the means for causing the computer to filter the reference, second and third processed information signals to remove the information component comprises means for causing the computer to input the reference, second and third processed information signals into respective band pass filters, each filter having a pass band and a center frequency, the means for causing the computer to vary the delay of the information signal comprises means for causing the computer to vary the center frequency of the pass bands of the filters to match the characteristic frequency of the noise component.

16. A method of rejecting RF noise introduced into an information signal, comprising the steps of:
 a) receiving an RF signal having an information component and a repetitive RF noise component having a varying characteristic frequency;
 b) delaying the RF signal by a reference delay time that is equal to a predetermined number of periods of the characteristic frequency to form a delayed RF signal;
 c) processing the RF signal and the delayed RF information signal to form a processed reference RF signal in which the information component is substantial and the RF noise component is negligible;
 d) determining the amplitude of the RF noise component of the processed reference RF signal; and
 e) varying the delay of the RF signal as the characteristic frequency of the RF noise component changes in order to maintain the amplitude of the RF noise component of the processed RF reference signal at a predetermined level.

* * * * *